(12) United States Patent
Cha et al.

(10) Patent No.: US 11,233,374 B2
(45) Date of Patent: Jan. 25, 2022

(54) SEMICONDUCTOR LASER DEVICE AND METHOD OF MANUFACTURING THE SAME

(71) Applicant: Samsung Electronics Co., Ltd., Suwon-si (KR)

(72) Inventors: Jung-Ho Cha, Yongin-si (KR);
Seong-Gu Kim, Pyeongtaek-si (KR);
Dong-Jae Shin, Seoul (KR);
Yong-Hwack Shin, Hwaseong-si (KR);
Kyoung-Ho Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

(21) Appl. No.: 16/152,661

(22) Filed: Oct. 5, 2018

(65) Prior Publication Data

US 2019/0229492 A1    Jul. 25, 2019

(30) Foreign Application Priority Data

Jan. 19, 2018    (KR) .................. 10-2018-0007323

(51) Int. Cl.
*H01S 5/02*        (2006.01)
*H01S 5/10*        (2021.01)
(Continued)

(52) U.S. Cl.
CPC ............. *H01S 5/021* (2013.01); *H01S 5/026* (2013.01); *H01S 5/0265* (2013.01); *H01S 5/02461* (2013.01); *H01S 5/0421* (2013.01); *H01S 5/1003* (2013.01); *H01S 5/2018* (2013.01); *H01S 5/3213* (2013.01); *H01S 5/32308* (2013.01); *H01S 5/32341* (2013.01); *H01S 5/4025* (2013.01); *H01S 5/0215* (2013.01);
(Continued)

(58) Field of Classification Search
CPC ...... H01S 5/021; H01S 5/0265; H01S 5/3213;
H01S 5/02461; H01S 5/32308; H01S
5/4025; H01S 5/0421; H01S 5/32341;
H01S 5/026; H01S 5/2018; H01S 5/1003;
H01S 5/2063; H01S 5/04257; H01S
5/0217; H01S 5/0215; H01S 5/227; H01S
5/4031; H01S 2304/04; H01S 5/125;
H01S 5/3402; H01S 5/343; H01S
5/34333; H01S 2304/00; H01S 5/223;
H01S 5/0425
See application file for complete search history.

(56) References Cited

U.S. PATENT DOCUMENTS 6,058,124 A * 5/2000 Sun ...................... H01S 5/4031
                                                            372/23
7,867,799 B2 * 1/2011 Hooper ............ H01L 21/02631
                                                            438/46
(Continued)

FOREIGN PATENT DOCUMENTS

CN    106684213 A    5/2017
JP    5858997        12/2015

*Primary Examiner* — Xinning(Tom) Niu
(74) *Attorney, Agent, or Firm* — Muir Patent Law, PLLC

(57) ABSTRACT

A semiconductor laser device includes a first cladding including gallium nitride (GaN) on a substrate, a light waveguide on the first cladding, a first contact pattern, a first SCH pattern, a first active pattern, a second SCH pattern, a second cladding and a second contact pattern sequentially stacked on the light waveguide, and first and second electrodes on the first and second contact patterns, respectively.

20 Claims, 7 Drawing Sheets

(51) Int. Cl.
  *H01S 5/20*   (2006.01)
  *H01S 5/024*  (2006.01)
  *H01S 5/026*  (2006.01)
  *H01S 5/323*  (2006.01)
  *H01S 5/042*  (2006.01)
  *H01S 5/40*   (2006.01)
  *H01S 5/32*   (2006.01)
  *H01S 5/343*  (2006.01)
  *H01S 5/34*   (2006.01)
  *H01S 5/125*  (2006.01)
  *H01S 5/227*  (2006.01)

(52) U.S. Cl.
  CPC ......... *H01S 5/0217* (2013.01); *H01S 5/04257* (2019.08); *H01S 5/125* (2013.01); *H01S 5/2063* (2013.01); *H01S 5/227* (2013.01); *H01S 5/3402* (2013.01); *H01S 5/343* (2013.01); *H01S 5/34333* (2013.01); *H01S 5/4031* (2013.01); *H01S 2304/04* (2013.01)

(56) References Cited

U.S. PATENT DOCUMENTS

| | | | |
|---|---|---|---|
| 8,693,509 | B2 | 4/2014 | Bowers et al. |
| 8,767,792 | B2 | 7/2014 | Bowers et al. |
| 8,891,577 | B2 | 11/2014 | Xu et al. |
| 9,653,382 | B2 | 5/2017 | Lin et al. |
| 9,709,735 | B2 | 7/2017 | Krasulick et al. |
| 2001/0038656 | A1* | 11/2001 | Takeuchi ............ H01S 5/32341 372/45.01 |
| 2013/0016752 | A1* | 1/2013 | Lell ...................... H01S 5/3013 372/50.1 |
| 2016/0070062 | A1 | 3/2016 | Lipson et al. |
| 2016/0094014 | A1* | 3/2016 | Shin ........................ G02B 6/12 372/45.01 |
| 2017/0205577 | A1 | 7/2017 | Ramaswamy et al. |

\* cited by examiner

US 11,233,374 B2

SEMICONDUCTOR LASER DEVICE AND METHOD OF MANUFACTURING THE SAME

CROSS-REFERENCE TO RELATED APPLICATION

This application claims the benefit of priority under 35 U.S.C. § 119 to Korean Patent Application No. 10-2018-0007323, filed on Jan. 19, 2018, in the Korean Intellectual Property Office (KIPO), the contents of which are herein incorporated by reference in their entirety.

BACKGROUND

1. Field

Example embodiments relate to a semiconductor laser device and a method of manufacturing the same.

2. Description of the Related Art

When a laser diode (LD) device is formed on a silicon-on-insulator (SOI) substrate, heat generated from the LD device may not be discharged into a substrate due to a silicon oxide layer, and thus the LD device may be deteriorated.

SUMMARY

Example embodiments provide a semiconductor laser device having improved characteristics.

Example embodiments provide a method of manufacturing a semiconductor laser device having improved characteristics.

According to certain example embodiments, the disclosure is directed to a semiconductor laser device, comprising: a first cladding on a substrate, the first cladding including gallium nitride (GaN); a light waveguide on the first cladding; a semiconductor laser source structure on the light waveguide, the semiconductor laser source structure comprising a first contact pattern, a first separate confinement heterostructure (SCH) pattern, a first active pattern, a second SCH pattern, a second cladding, and a second contact pattern sequentially stacked on the light waveguide; and first and second electrodes on the first and second contact patterns, respectively.

According to certain example embodiments, the disclosure is directed to a semiconductor laser device, comprising: a first cladding on a substrate, the first cladding including gallium nitride (GaN); first and second light waveguides on the first cladding, the first and second light waveguides including silicon (Si) and titanium oxide ($TiO_2$), respectively; first and second semiconductor laser source structures on the first and second light waveguides, respectively; first and second electrodes connected to the first semiconductor laser source structure; and third and fourth electrodes connected to the second semiconductor laser source structure.

According to certain example embodiments, the disclosure is directed to a method of manufacturing a semiconductor laser device, the method comprising: forming a first cladding on a substrate, the first cladding including gallium nitride (GaN); forming a light waveguide on the first cladding; forming a semiconductor laser source structure on the light waveguide, the semiconductor laser source structure comprising a first contact pattern, a first separate confinement heterostructure (SCH) pattern, an active pattern, a second SCH pattern, a second cladding, and a second contact pattern sequentially stacked on the light waveguide; and forming first and second electrodes on the first and second contact patterns, respectively.

DETAILED DESCRIPTION

Example embodiments will be more clearly understood from the following detailed description taken in conjunction with the accompanying drawings.

Figure 1:
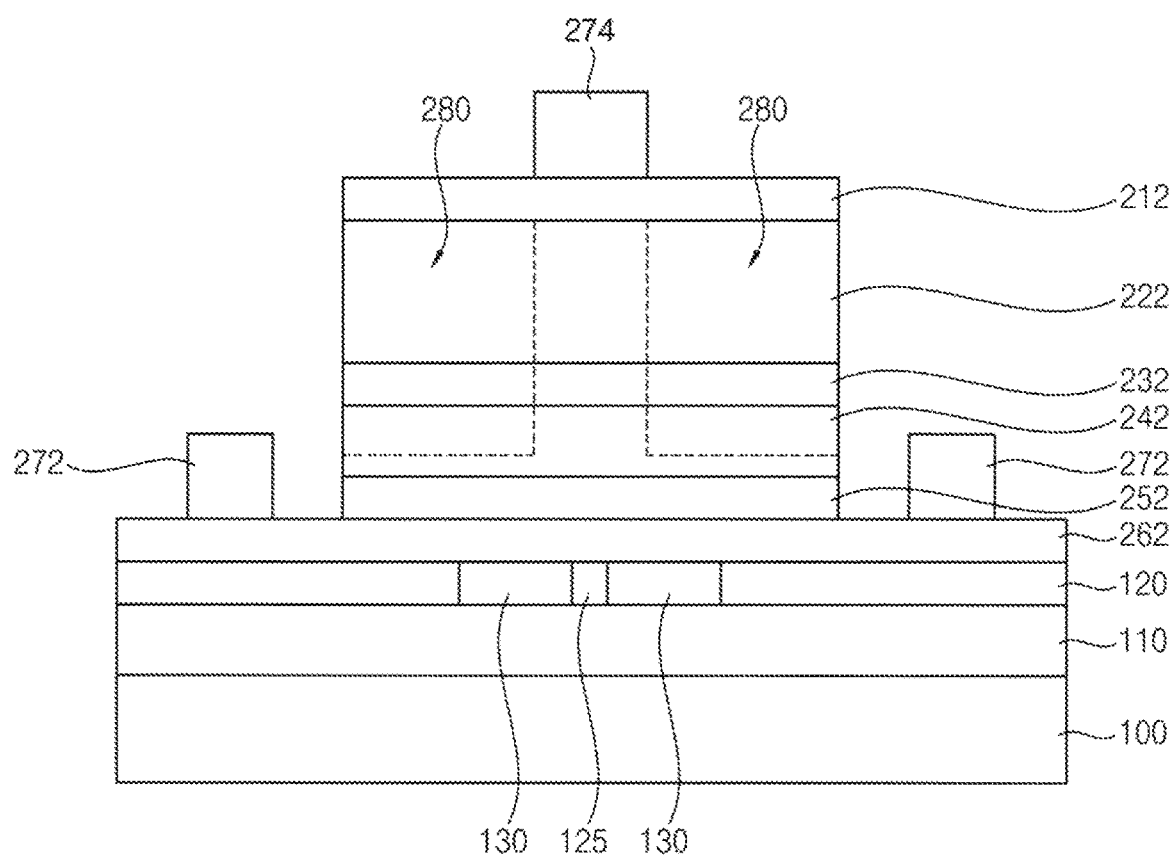
FIG. 1 is a cross-sectional view illustrating a first semiconductor laser device in accordance with example embodiments.

FIG. 1 is a cross-sectional view illustrating a first semiconductor laser device in accordance with example embodiments.

Referring to FIG. 1, the first semiconductor laser device may include a first cladding 110, a first light waveguide 125, and a first semiconductor laser source structure sequentially stacked on a first substrate 100. The first semiconductor laser device may further include a second cladding 130 covering each of opposite sidewalls of the first light waveguide 125, a second substrate 120 containing the first light waveguide 125 and the second cladding 130, and first and second electrodes 272 and 274.

The first substrate 100 may be a semiconductor substrate, e.g., a silicon substrate, a germanium substrate, etc. In example embodiments, the first substrate 100 may be a silicon substrate having (111) crystal plane. The first substrate 100 may be doped with p-type or n-type impurities.

In example embodiments, the first cladding 110 may include a material having a refractive index less than that of silicon (Si) and a heat conductivity more than that of silicon oxide ($SiO_2$). The first cladding 110 may include, e.g., single crystalline gallium nitride (GaN). In some embodiments, the first cladding 110 may be doped with, e.g., carbon (C) or iron (Fe), thereby increasing insulative properties of the first cladding 110.

The second substrate 120 may be bonded to an upper surface of the first cladding 110. The second substrate 120 may be a semiconductor substrate, e.g., a silicon substrate or a germanium substrate. In example embodiments, the second substrate 120 may be a silicon substrate having (100) crystal plane. Alternatively, the second substrate 120 may be a silicon substrate having (111) crystalline plane.

The first light waveguide 125 may be contained in the second substrate 120. For example, the top and bottom surfaces of the first light waveguide 125 may be at the same vertical heights as the respective top and bottom surfaces of the second substrate 120. The first light waveguide 125 may be formed on the upper surface of the first cladding 110, and may have a bar shape extending in a first direction substantially parallel to an upper surface of the first substrate 100. The bar shape may be, for example, an oblong block shape elongated in the first direction. The first light waveguide 125 may be formed by etching a portion of the second substrate 120, and thus may include substantially the same material as that of the second substrate 120. Thus, the first light waveguide 125 may include a semiconductor material, e.g., silicon, germanium, etc., and may include, e.g., silicon having (100) crystal plane. The first light waveguide 125 may have a higher refractive index than that of the first cladding 110 and the second cladding 130.

The second cladding 130 may be contained in the second substrate 120, and may cover each of opposite sidewalls of the first light waveguide 125. For example, the top and bottom surfaces of the second cladding 130 may be at the same vertical heights as the respective top and bottom surfaces of the second substrate 120. The second cladding 130 may be formed on the upper surface of the first cladding 110, and may cover each of opposite sidewalls of the first light waveguide 125 in a second direction substantially perpendicular to the first substrate 100. The second cladding 130 may include a material having a refractive index less than that of silicon of the first light waveguide 125, e.g., silicon oxide ($SiO_2$) or silicon nitride (SiN). Alternatively, the second cladding 130 may include air.

In example embodiments, the first semiconductor laser source structure may have a laser structure of separate confinement heterostructure (SCH). For example, the first semiconductor laser source structure may include a first contact pattern 262, a first SCH pattern 252, a first active pattern 242, a second SCH pattern 232, a third cladding 222 and a second contact pattern 212 sequentially stacked on the second substrate 120, which contains the first light waveguide 125 and the second cladding 130, each of which may include III-V group materials.

The first contact pattern 262 may include, e.g., indium phosphide (InP) doped with n-type impurities. The first contact pattern 262 may have a width in the second direction greater than that of a first semiconductor laser source structure including the first SCH pattern 252, the first active pattern 242, the second SCH pattern 232, the third cladding 222 and the second contact pattern 212 sequentially stacked on the first contact pattern 262. In example embodiments, the first contact pattern 262 and the first semiconductor laser source structure may extend in the first direction.

The first and second SCH patterns 252 and 232 may include a material having a refractive index less than that of the first active pattern 242 and more than that of the third cladding 222. The first and second SCH patterns 252 and 232 may include a material doped with n-type impurities and p-type impurities, respectively. The first SCH pattern 252 may include, e.g., indium gallium aluminum arsenide (InGaAlAs) doped with n-type impurities, the first active pattern 242 may include, e.g., undoped indium gallium aluminum arsenide (InGaAlAs), and the second SCH pattern 232 may include, e.g., indium gallium aluminum arsenide (InGaAlAs) doped with p-type impurities.

The third cladding 222 may include, e.g., indium phosphide (InP) doped with p-type impurities, and the second contact pattern 212 may include, e.g., indium gallium arsenide (InGaAs) doped with p-type impurities.

In other example embodiments, the first semiconductor laser source structure may include a double heterostructure laser, a quantum well (QW) laser, a quantum cascade laser, an interband cascade laser, a distributed Bragg reflector (DBR) laser, etc.

The first and second electrodes 272 and 274 may be formed on the first and second contact patterns 262 and 212, respectively. In example embodiments, the first electrode 272 may be spaced apart from the first semiconductor laser source structure in the second direction, and the second electrode 274 may overlap the first light waveguide 125 in a vertical direction substantially perpendicular to the upper surface of the first substrate 100 and may extend in the first direction. Each of the first and second electrodes 272 and 274 may include a conductive material, e.g., a metal, a metal nitride, etc.

A first current blocking region 280 may be a region of the first semiconductor laser source structure doped with protons, and may block paths of current applied by the first and second electrodes 272 and 274. In example embodiments, the first current blocking region 280 may be formed in an upper portion of the first active pattern 242, the second SCH pattern 232 and the third cladding 222. In example embodiments, the first current blocking region 280 may extend in the first direction, and may not overlap the first light waveguide 125 in the vertical direction, the vertical direction being perpendicular to the first and second directions.

In the first semiconductor laser device, voltage may be applied to the first and second electrodes 272 and 274 so that current may be generated through structures between the first and second electrodes 272 and 274, i.e., through the first contact pattern 262, the first SCH pattern 252, the first active pattern 242, the second SCH pattern 232, the third cladding 222 and the second contact pattern 212. Paths of the current may be restricted by the first current blocking region 280, with the current paths remaining within portions of the first active pattern 242, the second SCH pattern 232, the third cladding 222 and the second contact pattern 212 overlapping the first light waveguide 125 in the vertical direction. For example, the current paths may be prevented from extending into the first current blocking region 280.

By the current, electrons and holes may be coupled with each other to generate laser in the first active pattern 242 between the first contact pattern 262 and the first SCH pattern 252 doped with n-type impurities and the second SCH pattern 232, the third cladding 222 and the second contact pattern 212 doped with p-type impurities, and the generated laser may move to the underlying first light waveguide 125. The first light waveguide 125 may include a material having a refractive index more than that of the second cladding 130 that covers each of opposite sidewalls of the first light waveguide 125 or that of the first cladding 110 that covers a bottom of the first light waveguide 125. For example, the generated laser may be guided by the first light waveguide 125 to move in the first direction, which may be the extension direction of the first light waveguide 125.

In example embodiments, the first cladding 110 may include a material having a high heat conductivity, e.g., gallium nitride (GaN), and thus the heat generated from the first semiconductor laser source structure may be effectively discharged into the first substrate 100. Accordingly, the deterioration of characteristics of the first semiconductor laser device due to heat may be enhanced, when compared to the conventional semiconductor laser device on an SOI substrate.

FIGS. 2 to 5 are cross-sectional views illustrating a method of manufacturing the first semiconductor laser device in accordance with example embodiments.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a physical contact (i.e., touching) unless the context indicates otherwise.

Figure 2:
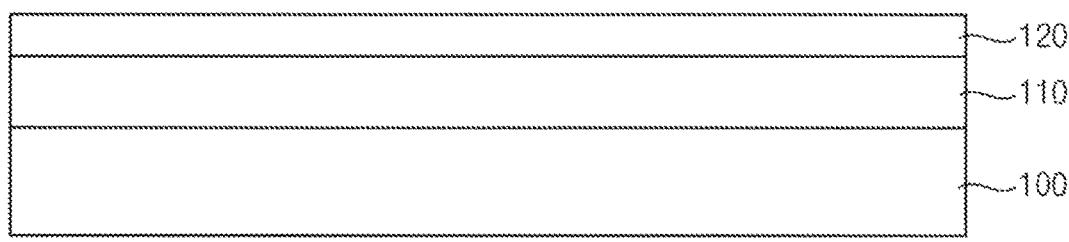
FIGS. 2 to 5 are cross-sectional views illustrating a method of manufacturing the first semiconductor laser device in accordance with example embodiments.

Referring to FIG. 2, a first cladding 110 and a second substrate 120 may be sequentially formed on a first substrate 100. For example, the first cladding 110 may be formed on the first substrate 100, contacting the first substrate 100, and the second substrate 120 may be formed on the first cladding 110, contacting the first cladding 110.

The first substrate 100 may be a semiconductor substrate, e.g., a silicon substrate, a germanium substrate, etc. In example embodiments, the first substrate 100 may be a silicon substrate having (111) crystal plane. The first substrate 100 may be doped with p-type or n-type impurities.

In example embodiments, the first cladding 110 may include a material having a refractive index less than that of silicon (Si) and a heat conductivity more than that of silicon oxide ($SiO_2$). The first cladding 110 may include, e.g., single crystalline gallium nitride (GaN). The first cladding 110 may be formed by, e.g., a metal organic chemical vapor deposition (MOCVD) process on the first substrate 100.

The second substrate 120 may be a semiconductor substrate, e.g., a silicon substrate, a germanium substrate, etc. In example embodiments, the second substrate 120 may be a silicon substrate having (100) crystal plane. Alternatively, the second substrate 120 may be a silicon substrate having (111) crystal plane.

The second substrate 120 may be formed on the first cladding 110 by bonding. After bonding the second substrate 120 on the first cladding 110, an upper portion of the second substrate 120 may be removed so that the thickness of the second substrate 120 may be reduced. The upper portion of the second substrate 120 may be removed by, e.g., an etching process or a grinding process.

Figure 3:
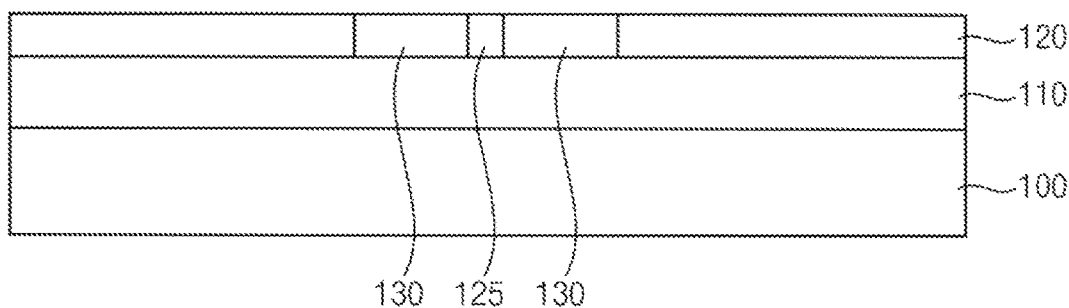

Referring to FIG. 3, the second substrate 120 may be partially removed to form a first opening exposing an upper surface of the first cladding 110, and a second cladding 130 may be formed to fill the first opening.

The first opening may be formed by an etching process using an etching mask (not shown) on the second substrate 120. In example embodiments, the first opening may extend in a first direction substantially parallel to an upper surface of the first substrate 100, and may include two first openings formed to be spaced apart from each other in a second direction substantially parallel to the upper surface of the substrate 100 and substantially perpendicular to the first direction.

A portion of the second substrate 120 remaining between the two first openings may form a first light waveguide 125, which may have a bar shape extending in the first direction. The bar shape may be, for example, an oblong block shape elongated in the first direction.

The second cladding 130 may be formed by forming a second cladding layer on the second substrate 120 to fill the first openings, and planarizing the second cladding layer until an upper surface of the second substrate 120 is exposed. The planarization process may include, e.g., a chemical mechanical polishing (CMP) process and/or an etching process. Top surfaces of the first light waveguide 125, the second cladding 130, and the second substrate 120 may be at substantially the same vertical level.

The second cladding 130 may include a material having a refractive index less than that of the first light waveguide 125, e.g., silicon oxide ($SiO_2$) or silicon nitride (SiN). Alternatively, the second cladding 130 may include air, and in this case, the formation process of the second cladding layer to fill the first opening may be skipped.

Figure 4:
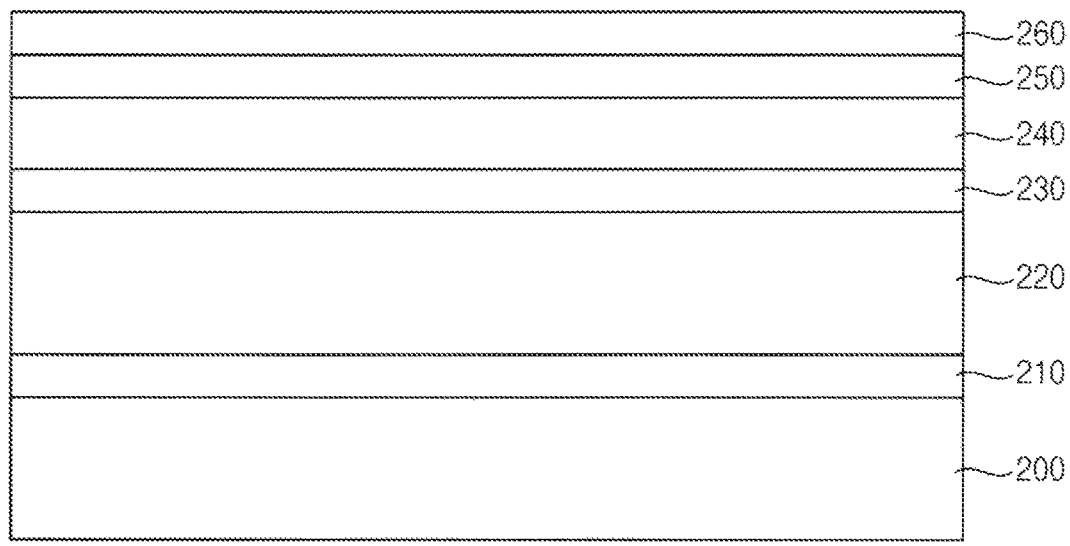

Referring to FIG. 4, a second contact layer 210, a third cladding layer 220, a second SCH layer 230, a first active layer 240, a first SCH layer 250 and a first contact layer 260 may be sequentially formed on a third substrate 200.

The third substrate 200 may serve as a handling substrate, and may include a semiconductor material, e.g., silicon, or an insulation material, e.g., glass.

Each of the second contact layer 210, the third cladding layer 220, the second SCH layer 230, the first active layer 240, the first SCH layer 250 and the first contact layer 260 may include III-V group materials.

In example embodiments, each of the first and second SCH layers 250 and 230 may include a material having a refractive index less than that of the first active layer 240 and more than that of the third cladding layer 220. The first SCH layer 250 and the first contact layer 260 may include a material doped with n-type impurities, and the second contact layer 210, the third cladding layer 220 and the second SCH layer 230 may include a material doped with p-type impurities.

Thus, the second contact layer 210 may include, e.g., indium gallium arsenide (InGaAs) doped with p-type impurities, the third cladding layer 220 may include, e.g., indium phosphide (InP) doped with p-type impurities, the second SCH layer 230 may include, e.g., indium gallium aluminum arsenide (InGaAlAs) doped with p-type impurities, the first active layer 240 may include, e.g., undoped indium gallium aluminum arsenide (InGaAlAs), the first SCH layer 250 may include, e.g., indium gallium aluminum arsenide (InGaAlAs) doped with n-type impurities, and the first contact layer 260 may include, e.g., indium phosphide (InP) doped with n-type impurities.

Figure 5:
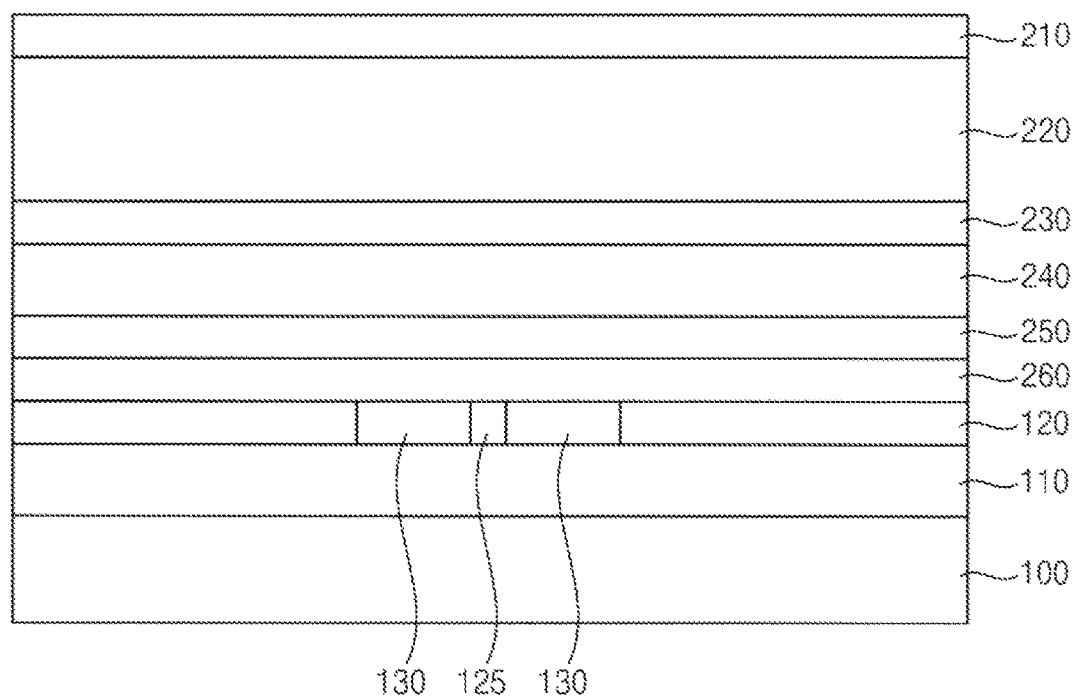

Referring to FIG. 5, after turning over the third substrate 200 (i.e., rotating by 180 degrees), the third substrate 200 and the second substrate 120 may be bonded with each other, so that the first contact layer 260 contacts an upper surface of the second substrate 120 at which the first light waveguide 125 and the second cladding 130 are formed. For example, the first contact layer 260 and the upper surface of the second substrate 120 may be in contact with one another at the areas of the second substrate 200 surrounding the first light waveguide 125 and the second cladding 130.

Thus, a first semiconductor laser source structure layer including the first contact layer 260, the first SCH layer 250, the first active layer 240, the second SCH layer 230, the third cladding layer 220 and the second contact layer 210 sequentially stacked may be formed on the second substrate 120.

Referring to FIG. 1 again, the second contact layer 210, the third cladding layer 220, the second SCH layer 230, the first active layer 240 and the first SCH layer 250 may be patterned to form a second contact pattern 212, a third cladding 222, a second SCH pattern 232, a first active pattern 242 and a first SCH pattern 252, respectively, and the first contact layer 260 may be also patterned to form a first contact pattern 262. Thus, a first semiconductor laser source structure including the first contact pattern 262, the first SCH pattern 252, the first active pattern 242, the second SCH pattern 232, the third cladding 222 and the second contact pattern 212 sequentially stacked may be formed on the second substrate 120.

The first contact pattern 262 may have a width in the second direction greater than that of a first semiconductor laser source structure including the first SCH pattern 252, the first active pattern 242, the second SCH pattern 232, the third cladding 222 and the second contact pattern 212. Each of the first contact pattern 262 and the first semiconductor laser source structure may extend in the first direction.

First and second electrodes 272 and 274 may be formed on the first and second contact patterns 262 and 212, respectively. In example embodiments, the first electrode 272 may be spaced apart from the first semiconductor laser source structure in the second direction, and the second electrode 274 may overlap the first light waveguide 125 in a vertical direction substantially perpendicular to the upper surface of the first substrate 100 and extend in the first direction. The first and second electrodes 272 and 274 may include, e.g., a metal, a metal nitride, etc.

Protons may be implanted into the first semiconductor laser source structure by an ion implantation process to complete the fabrication of the first semiconductor laser device.

In example embodiments, the protons may be doped into the first semiconductor laser source structure using the second electrode 274 as an ion implantation mask, and may pass through the second contact pattern 212 to reach a portion of the first active pattern 242. For example, the protons may be doped into an upper portion of the first active pattern 242, the second SCH pattern 232 and the third cladding 222, so as to form a first current blocking region 280. In example embodiments, the first current blocking region 280 may extend in the first direction, and may not overlap the first light waveguide 125 in the vertical direction.

Figure 6:
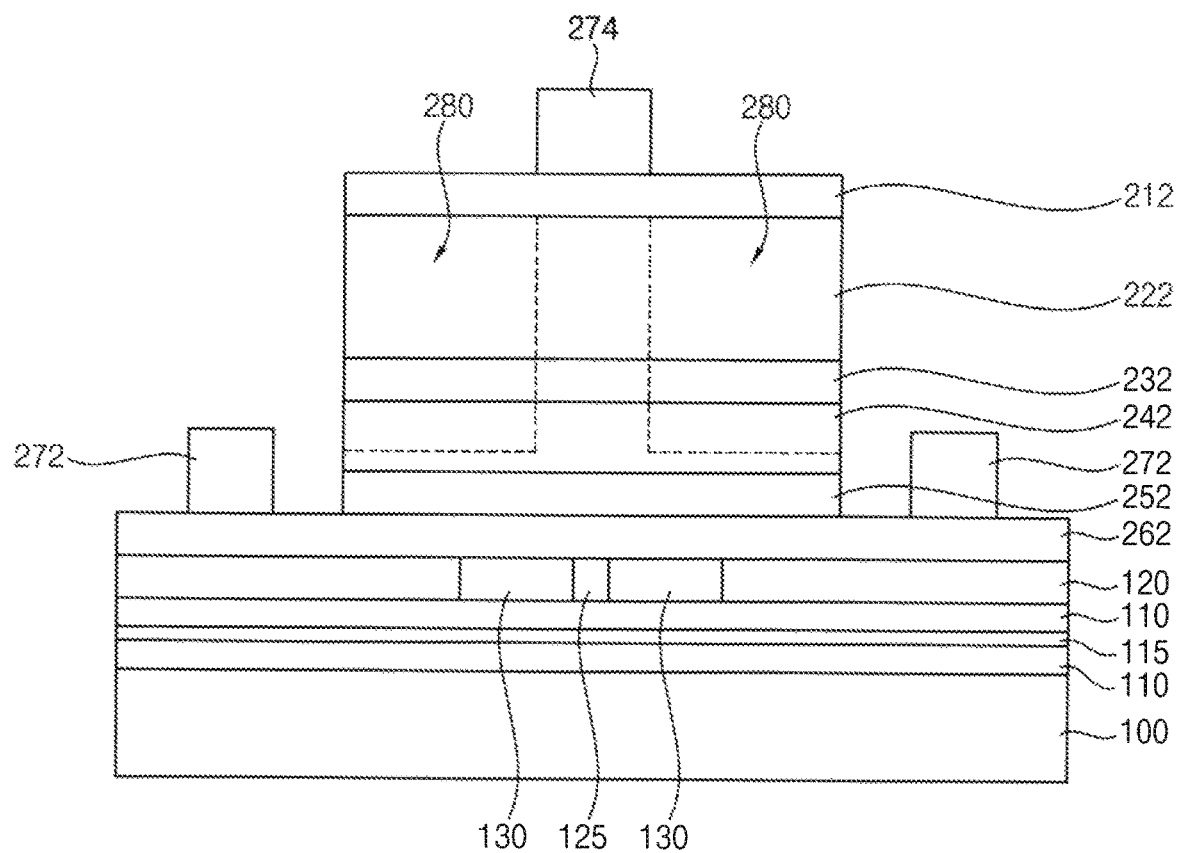
FIG. 6 is a cross-sectional view illustrating a second semiconductor laser device in accordance with example embodiments.

FIG. 6 is a cross-sectional view illustrating a second semiconductor laser device in accordance with example embodiments. The second semiconductor laser device may be substantially the same as or similar to the first semiconductor laser device, except that the second semiconductor laser device further includes a second active pattern. Thus, like reference numerals refer to like elements, and detailed descriptions thereon are omitted herein.

Referring to FIG. 6, the second semiconductor laser device may further include a second active pattern 115 in the first cladding 110. For example, the second active pattern 115 may be formed between upper and lower portions of the first cladding 110, and the upper and lower portions of the first cladding 110 may sandwich the second active pattern 115.

The second active pattern 115 may include, e.g., indium gallium nitride (InGaN), indium aluminum gallium nitride (InAlGaN), aluminum nitride (AlN), etc., and may have a thin thickness as a quantum well (QW).

When the second active pattern 115 is formed, a third electrode (not shown) may be further formed beneath the first substrate 100, and laser may be generated in the second active pattern 115 by current between the third electrode and the first electrode 272, as in the first active pattern 242. The generated laser may move to the overlying first light waveguide 125, and may be guided by the first light waveguide 125 to move in the first direction. Thus, the second active pattern 115 may serve as a modulator for modulating the generated laser in the first active pattern 242.

Figure 7:
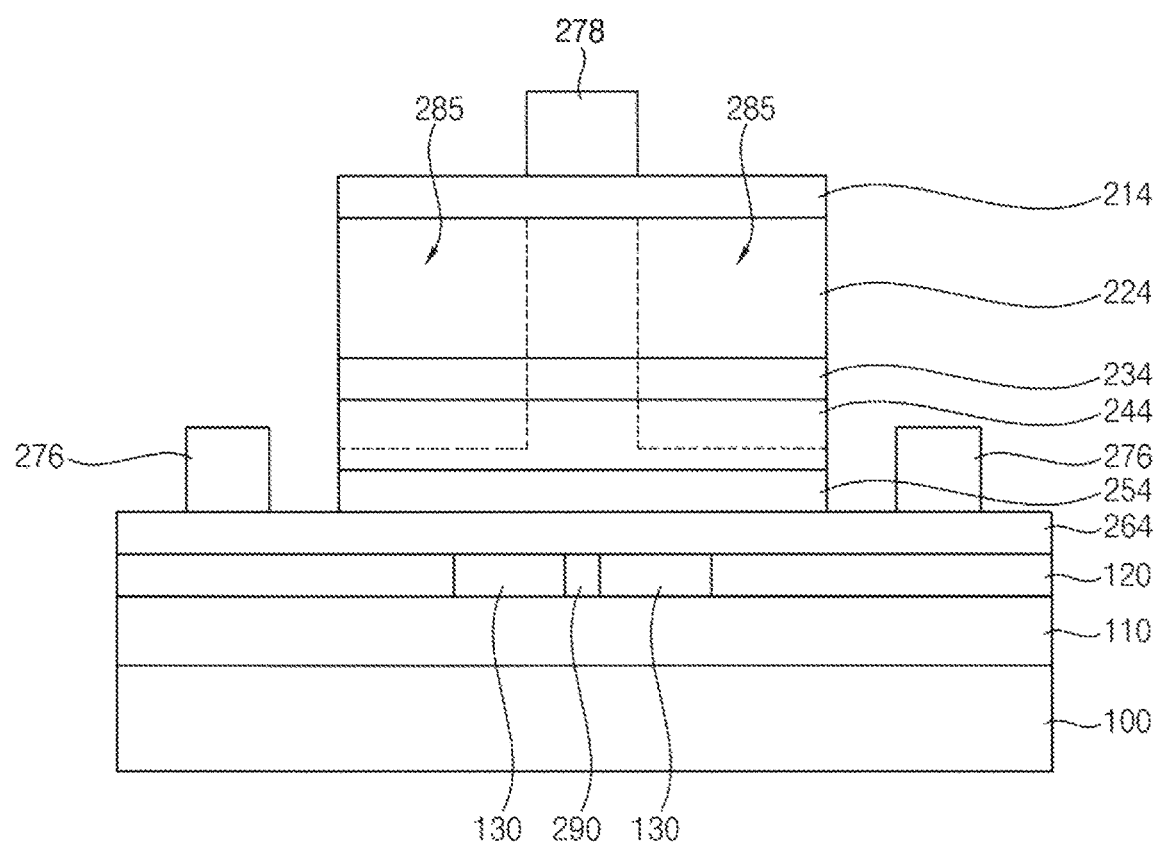
FIG. 7 is a cross-sectional view illustrating a third semiconductor laser device in accordance with example embodiments.

FIG. 7 is a cross-sectional view illustrating a third semiconductor laser device in accordance with example embodiments. The third semiconductor laser device may be substantially the same as or similar to the first semiconductor laser device, except that the third semiconductor laser device includes a second light waveguide instead of the first light waveguide. Thus, like reference numerals refer to like elements, and detailed descriptions thereon are omitted herein.

Referring to FIG. 7, the third semiconductor laser device may include the first cladding 110, a second light waveguide 290 and a second semiconductor laser source structure sequentially stacked on the first substrate 100. The third semiconductor laser device may further include the second cladding 130 covering each of opposite sidewalls of the second light waveguide 290, the second substrate 120 containing the second light waveguide 290 and the second cladding 130, and fourth and fifth electrodes 276 and 278.

A bottom of the second light waveguide 290 may be covered by the first cladding 110, and each of opposite sidewalls of the light waveguide 290 in the second direction may be covered by the second cladding 130. In example embodiments, the second light waveguide 290 may include, e.g., titanium oxide ($TiO_2$). Titanium oxide of the second light waveguide 290 may have an absorption coefficient of light less than that of silicon of the first light waveguide 125 in a short wavelength range, and thus may serve as a light waveguide with less or no light loss. For example, the first light waveguide 125 of FIG. 1 may be used in a long wavelength range of about 1100 nm to about 1600 nm, and the second light waveguide 290 of FIG. 7 may be used in a short wavelength range of about 300 nm to about 500 nm.

In the third semiconductor laser device including the second light waveguide 290, the first cladding 110 may include, e.g., silicon oxide of the conventional SOI substrate instead of gallium nitride (GaN).

The second semiconductor laser source structure may have a SCH laser structure the same as that of FIG. 1. For example, the second semiconductor laser source structure may include a third contact pattern 264, a third SCH pattern 254, a third active pattern 244, a fourth SCH pattern 234, a fourth cladding 224 and a fourth contact pattern 214 sequentially stacked on the second substrate 120 containing the second light waveguide 290 and the second cladding 130, each of which may include III-V group materials, and a second current blocking region 285 may be formed in an upper portion of the third active pattern 244, the fourth SCH pattern 234 and the fourth cladding 224. The third contact pattern 264, the third SCH pattern 254, the third active pattern 244, the fourth SCH pattern 234, the fourth cladding 224 and the fourth contact pattern 214 may be formed of the same materials and in the same manner as the first contact pattern 262, the first SCH pattern 252, the first active pattern 242, the second SCH pattern 232, the third cladding 222 and the second contact pattern 212, respectively, as described in connection with FIGS. 1-5. Likewise, the second current blocking region 285 may be formed of the same materials and in the same manner as the first current blocking region 280, as described in connection with FIGS. 1-5.

Figure 8:
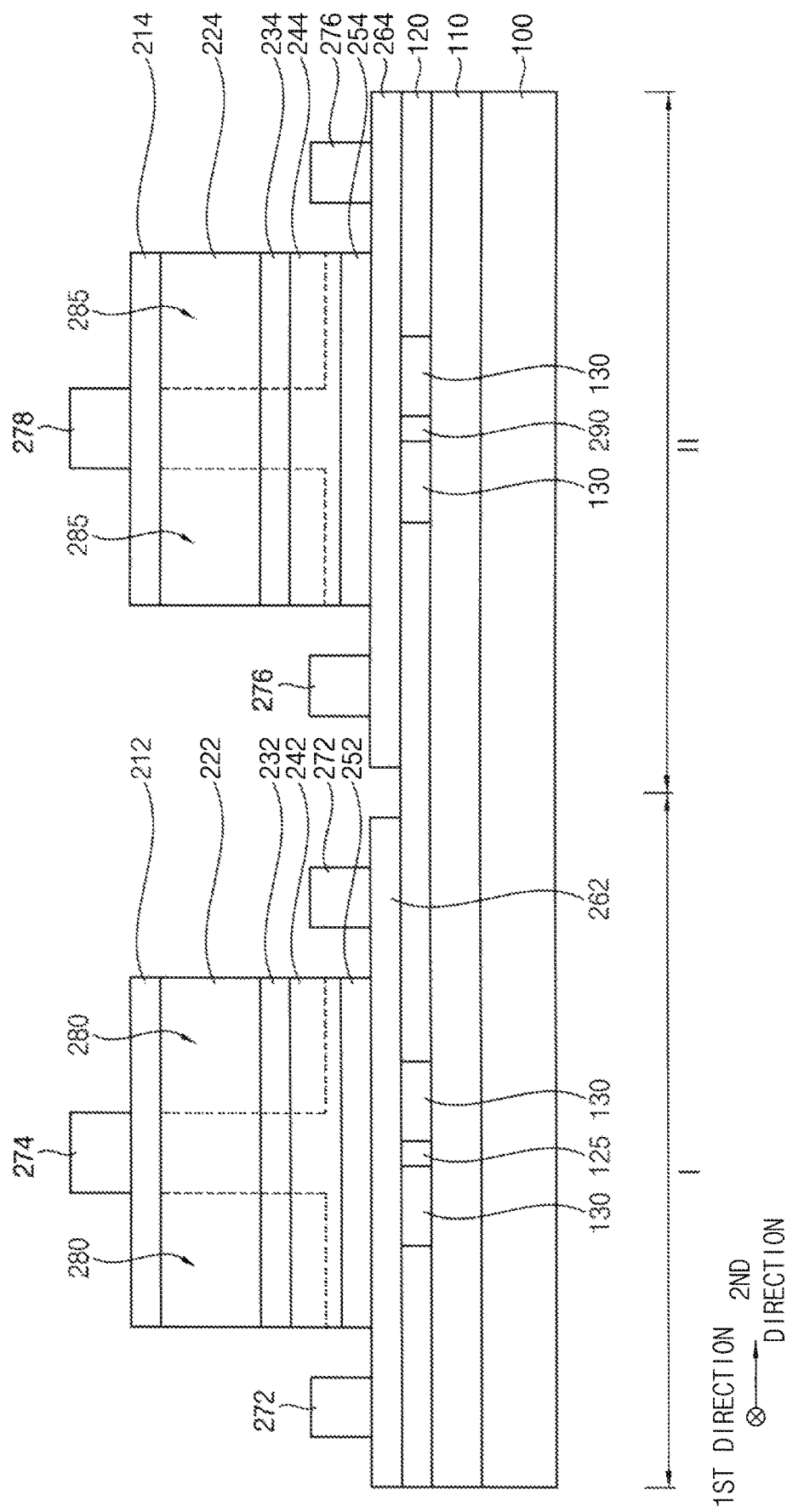
FIG. 8 is a cross-sectional view illustrating a fourth semiconductor laser device in accordance with example embodiments.

FIG. 8 is a cross-sectional view illustrating a fourth semiconductor laser device in accordance with example embodiments. The fourth semiconductor laser device includes the first semiconductor laser device of FIG. 1 and the third semiconductor laser device of FIG. 7 on the first substrate 100 and the first cladding 110. Thus, like reference numerals refer to like elements, and detailed descriptions thereon are omitted herein.

Referring to FIG. 8, the fourth semiconductor laser device may include the first cladding 110 and the second substrate 120 sequentially stacked on the first substrate 100 including first and second regions I and II.

Additionally, the fourth semiconductor laser device may include the first light waveguide 125 and the first semiconductor laser source structure sequentially on the first region I of the first substrate 100, the second cladding 130 contained in the second substrate 120 and covering each of opposite sidewalls of the first light waveguide 125, and the first and second electrodes 272 and 274. The fourth semiconductor laser device may further include the second light waveguide 290 and the second semiconductor laser source structure sequentially on the second region II of the first substrate 100, the second cladding 130 contained in the second substrate 120 and covering each of opposite sidewalls of the second light waveguide 290, and the fourth and fifth electrodes 276 and 278.

In example embodiments, the first and second light waveguides 125 and 290 and the first and second semiconductor laser source structures may be formed on the same first substrate 100, and thus carbon (C) or iron (Fe) may be doped into the first cladding 110 so as to increase the insulation property of the first cladding 110.

As illustrated above, the first light waveguide 125 on the first region I of the first substrate 100 may guide light in a relatively long wavelength range (e.g., about 1100 nm to about 1600 nm), and the second light waveguide 290 on the second region II of the first substrate 100 may guide light in a relatively short wavelength range (e.g., 300 nm to about 500 nm).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor laser device, comprising:
    a first cladding on and directly contacting a substrate, the first cladding including gallium nitride (GaN);
    a light waveguide on and directly contacting the first cladding;
    a third cladding on and directly contacting the first cladding, the third cladding covering each of opposite sidewalls of the light waveguide;
    a semiconductor laser source structure on the light waveguide, the semiconductor laser source structure comprising a first contact pattern, a first separate confinement heterostructure (SCH) pattern, a first active pattern, a second SCH pattern, a second cladding, and a second contact pattern sequentially stacked on the light waveguide; and
    first and second electrodes on the first and second contact patterns, respectively.

2. The semiconductor laser device of claim 1, wherein the light waveguide includes silicon.

3. The semiconductor laser device of claim 1, wherein the light waveguide includes titanium oxide (TiO$_2$).

4. The semiconductor laser device of claim 1, wherein the light waveguide has a bar shape extending in a direction.

5. The semiconductor laser device of claim 1, wherein the third cladding includes silicon oxide (SiO$_2$), silicon nitride (SiN), or air.

6. The semiconductor laser device of claim 1, wherein the first cladding is doped with carbon (C) or iron (Fe).

7. The semiconductor laser device of claim 1, further comprising a second active pattern in the first cladding.

8. The semiconductor laser device of claim 7, wherein the second active pattern includes indium gallium nitride (InGaN), indium gallium aluminum nitride (InGaAlN), or aluminum nitride (AlN).

9. The semiconductor laser device of claim 1,
    wherein each of the first SCH pattern, the first active pattern, and the second SCH pattern includes indium gallium aluminum arsenide (InGaAlAs), and
    wherein the first and second SCH patterns are doped with n-type impurities and p-type impurities, respectively.

10. The semiconductor laser device of claim 1, wherein the first contact pattern includes indium phosphide (InP) doped with n-type impurities, the second cladding includes indium phosphide (InP) doped with p-type impurities, and the second contact pattern includes indium gallium arsenide (InGaAs) doped with p-type impurities.

11. The semiconductor laser device of claim 1,
    wherein portions of the first active pattern, the second SCH pattern, and the second cladding are doped with protons, so that paths of current flowing between the first and second electrodes are restricted, and
    wherein the portions are not overlapping the light waveguide in a vertical direction.

12. A semiconductor laser device, comprising:
    a first cladding on and directly contacting a substrate, the first cladding including gallium nitride (GaN);
    first and second light waveguides on and directly contacting the first cladding, the first and second light waveguides including silicon (Si) and titanium oxide (TiO$_2$), respectively;
    fourth and fifth claddings on and directly contacting the first cladding, the fourth cladding covering each of opposite sidewalls of the first light waveguide and the fifth cladding covering each of opposite sidewalls of the second light waveguide;
    first and second semiconductor laser source structures on the first and second light waveguides, respectively;
    first and second electrodes connected to the first semiconductor laser source structure; and
    third and fourth electrodes connected to the second semiconductor laser source structure.

13. The semiconductor laser device of claim 12,
    wherein the first semiconductor laser source structure includes a first contact pattern, a first separate confinement heterostructure (SCH) pattern, a first active pattern, a second SCH pattern, a second cladding and a second contact pattern sequentially stacked, and
    wherein the second semiconductor laser source structure includes a third contact pattern, a third SCH pattern, a second active pattern, a fourth SCH pattern, a third cladding and a fourth contact pattern sequentially stacked.

14. The semiconductor laser device of claim 13, further comprising a third active pattern in the first cladding, the third active pattern including indium gallium nitride (InGaN), indium gallium aluminum nitride (InGaAlN), or aluminum nitride (AlN).

15. The semiconductor laser device of claim 12, wherein each of the first and second light waveguides has a bar shape extending in a direction.

16. The semiconductor laser device of claim 12, wherein each of the fourth and fifth claddings includes silicon oxide ($SiO_2$), silicon nitride (SiN), or air.

17. The semiconductor laser device of claim 12, wherein the first cladding is doped with carbon (C) or iron (Fe).

18. A semiconductor laser device, comprising:
- a first cladding on a substrate, the first cladding including gallium nitride (GaN);
- a light waveguide on and contacting the first cladding;
- a second cladding on and contacting the first cladding, the second cladding covering opposite sidewalls of the light waveguide;
- a semiconductor laser source structure on the light waveguide, the semiconductor laser source structure comprising a first contact pattern, a first separate confinement heterostructure (SCH) pattern, a first active pattern, a second SCH pattern, a third cladding, and a second contact pattern sequentially stacked on the light waveguide;
- a plurality of first electrodes on the first contact pattern; and
- a second electrode on the second contact pattern,
- wherein an upper surface of the light waveguide is at the same vertical level as an upper surface of the second cladding, and
- wherein a lower surface of the light waveguide is at the same vertical level as a lower surface of the second cladding and an upper surface of the first cladding.

19. The semiconductor laser device of claim 18,
- wherein the first cladding is doped with carbon (C) or iron (Fe), and
- wherein the second cladding includes silicon oxide ($SiO_2$), silicon nitride (SiN), or air.

20. The semiconductor laser device of claim 18, further comprising a second active pattern in the first cladding.

* * * * *